(12) United States Patent
Holm et al.

(10) Patent No.: US 6,984,816 B2
(45) Date of Patent: Jan. 10, 2006

(54) VERTICALLY INTEGRATED PHOTOSENSOR FOR CMOS IMAGERS

(75) Inventors: Paige M. Holm, Phoenix, AZ (US);
Jon J. Candelaria, Scottsdale, AZ (US)

(73) Assignee: Motorola, Inc., Schaumburg, IL (US)

( * ) Notice: Subject to any disclaimer, the term of this patent is extended or adjusted under 35 U.S.C. 154(b) by 252 days.

(21) Appl. No.: 10/641,216

(22) Filed: Aug. 13, 2003

(65) Prior Publication Data

US 2005/0040316 A1 Feb. 24, 2005

(51) Int. Cl.
*H01J 40/14* (2006.01)
(52) U.S. Cl. ............................... 250/214 R; 250/208.1
(58) Field of Classification Search ............ None
See application file for complete search history.

(56) References Cited

U.S. PATENT DOCUMENTS 6,887,769 B2 * 5/2005 Kellar et al. ................ 438/455

* cited by examiner

*Primary Examiner*—Que T. Le

(57) ABSTRACT

An exemplary system and method for providing a vertically integrated photosensing element suitably adapted for use in CMOS imaging applications is disclosed as comprising inter alia: a processed CMOS layer (420); and a photosensing element (380) fabricated in a vertically integrated optically active layer (320, 350), where the optically active layer (320, 350) is bonded to the CMOS layer (420) and the optically active layer (320, 350) is positioned near a metalization surface (405) of the CMOS layer (420). Disclosed features and specifications may be variously controlled, configured, adapted or otherwise optionally modified to further improve or otherwise optimize photosensing performance or other material characteristics. Exemplary embodiments of the present invention representatively provide for integrated photosensing components that may be readily incorporated with existing technologies for the improvement of CMOS imaging, device package form factors, weights and/or other manufacturing, device or material performance metrics.

16 Claims, 6 Drawing Sheets

VERTICALLY INTEGRATED PHOTOSENSOR FOR CMOS IMAGERS

FIELD OF INVENTION

The present invention generally relates to semiconductor and imaging devices; and more particularly, to systems and methods for vertically integrating photosensing elements for use in CMOS imaging applications.

BACKGROUND

CMOS imagers have begun to challenge CCDs in many electronic imaging applications and are gaining in popularity. The primary advantages of CMOS imagers are their relatively low cost generally resulting from the use of standard, high-volume CMOS processes and their ability to be integrated with native CMOS electronics for control and image processing; this in contrast to CCDs, which typically employ specialized processing optimized for image capturing operations that are not generally amenable to large-scale integration of electronics.

Because the photodiodes (PDs) of CMOS imagers are usually fabricated within the same material layer and with similar processes as the electronics, and these materials and processes are often dominated by and optimized for electronic circuitry, the optical and optoelectronic design of the photosensor are generally compromised. Representative limitations involve the Si material itself wherein a fixed band gap generally obstructs the use of band gap engineering as an effective design tool. The material may be responsive to light at visible wavelengths enabling use for many imaging/camera applications, but very weak in the near-IR spectral region where additional applications may exist. Due to the indirect band gap, light absorption may be relatively weak, even at visible wavelengths. Accordingly, thick absorbing layers and deep junctions may be needed to achieve high efficiency; these same design criteria generally being in conflict with those for high performance electronic applications.

Incompatibility between the optoelectronic and electronic requirements may be further exacerbated by current scaling trends—in terms of both the pixel pitch and the progression to smaller critical dimension CMOS process technologies (i.e., technology scaling). As the size of the pixel shrinks to reduce the cost of imaging chips, the illuminated area of the photodetector is also typically reduced thereby decreasing the captured signal level. Moreover, as the photodetector active area is reduced, the dark current becomes dominated by the perimeter causing inter alia the noise current density to increase. Together, these effects generally operate to degrade the signal to noise performance of the sensor.

There is a current trend that involves increasing the amount of electronic circuitry within each pixel from about the 3–4 transistor level for active pixel sensors (APS) to more than about 100 transistors for digital pixel sensors (DPS). This desire for increased signal processing functionality within the pixel escalates competition for 'real estate' within the pixel area creating additional problems generally associated with shrinking the PD active area, reducing the fill factor within the pixel, and applying advanced process technologies.

Migration to advanced process technologies may further compromise PD device design and performance. 0.25 $\mu$ technologies and beyond typically employ silicides that are optically opaque and potentially leaky, as well as shallow trench isolation (STI) which may often lead to higher perimeter-generated dark current levels. Furthermore, reduced lateral dimensions are generally attended by reduced vertical dimensions leading to thinner layers and shallower junctions as well as higher doping levels and reduced carrier diffusion lengths. Reduced supply voltages also may negatively impact charge collection and storage capability of the PD. Moreover, an ever-increasing number of interconnect levels and corresponding isolating dielectric layers generally decreases the optical throughput and coupling efficiency to the photodetector and introduces additional sources of reflection and scattering that can lead to elevated levels of optical crosstalk.

Efforts to improve the level of PD performance can limit flexibility and performance in the CMOS electronics as well. Minimizing the number of interconnect levels to improve the optical coupling to the PD, for example, may make interconnect routing more difficult and less area-efficient.

The co-integration of the photosensor with the CMOS electronics (i.e., within the same material layer, using the same processes, etc.) within the pixel of CMOS imagers may severely limit both the performance of the photosensor and the flexibility of the system architectural design. This problem may be further complicated by progression to more advanced CMOS technology generations which generally utilize trench isolation, non-transparent silicides, and increasing numbers of interconnect levels. The current trend toward increase functionality within the pixel (as with digital pixel sensors—DPS) adds more electronic circuitry within the pixel creating competition for pixel area, decreasing fill factor and further compromising of performance. To allow enhanced optimization of the photosensing and the electronics functions, as well as greater flexibility in architectural design, a new imager platform is needed.

SUMMARY OF THE INVENTION

In various representative aspects, the present invention provides vertically integrated photosensors for CMOS imagers using 3D integration schemes in which inter alia a monocrystalline active layer is incorporated over and in close proximity to a processed CMOS wafer. The monocrystalline layer may be transferred to the CMOS wafer by means of, for example, wafer to wafer (or die to wafer) bonding followed by substrate removal. The vertically integrated photosensing layer is sufficiently proximate to the final metallization of the CMOS wafer to provide inter alia a high density of interconnects for electrical contact within each pixel of the photosensitive material. An exemplary method for fabricating such a device is disclosed as comprising the steps of inter alia: a processed CMOS layer; and a photosensing element fabricated in a vertically integrated optically active layer, where the optically active layer is bonded to the CMOS layer and the optically active layer is positioned near a metalization surface of the CMOS layer to allow an interconnect for electrical contact within the optically active layer to be made.

Additional advantages of the present invention will be set forth in the Detailed Description which follows and may be obvious from the Detailed Description or may be learned by practice of exemplary embodiments of the invention. Still other advantages of the invention may be realized by means of any of the instrumentalities, methods or combinations particularly pointed out in the claims.

BRIEF DESCRIPTION OF THE DRAWING

Representative elements, operational features, applications and/or advantages of the present invention reside inter alia in the details of construction and operation as more fully hereafter depicted, described and claimed—reference being made to the accompanying drawings forming a part hereof, wherein like numerals refer to like parts throughout. Other elements, operational features, applications and/or advantages will become apparent to skilled artisans in light of certain exemplary embodiments recited in the Detailed Description, wherein:

Those skilled in the art will appreciate that elements in the Figures are illustrated for simplicity and clarity and have not necessarily been drawn to scale. For example, the dimensions of some of the elements in the Figures may be exaggerated relative to other elements to help improve understanding of various embodiments of the present invention. Furthermore, the terms 'first', 'second', and the like herein, if any, are used inter alia for distinguishing between similar elements and not necessarily for describing a sequential or chronological order. Moreover, the terms front, back, top, bottom, over, under, and the like in the Description and/or in the claims, if any, are generally employed for descriptive purposes and not necessarily for comprehensively describing exclusive relative position. Skilled artisans will therefore understand that any of the preceding terms so used may be interchanged under appropriate circumstances such that various embodiments of the invention described herein, for example, are capable of operation in other orientations than those explicitly illustrated or otherwise described.

DETAILED DESCRIPTION OF EXEMPLARY EMBODIMENTS

The following descriptions are of exemplary embodiments of the invention and the inventors' conceptions of the best mode and are not intended to limit the scope, applicability or configuration of the invention in any way. Rather, the following Description is intended to provide convenient illustrations for implementing various embodiments of the invention. As will become apparent, changes may be made in the function and/or arrangement of any of the elements described in the disclosed exemplary embodiments without departing from the spirit and scope of the invention.

A detailed description of an exemplary application, namely a system and method for providing a vertically integrated photosensing device suitably adapted for use in CMOS imaging applications is presented as a specific enabling disclosure that may be readily generalized by skilled artisans to any application of the disclosed system and method in accordance with various embodiments of the present invention.

Figure 1:
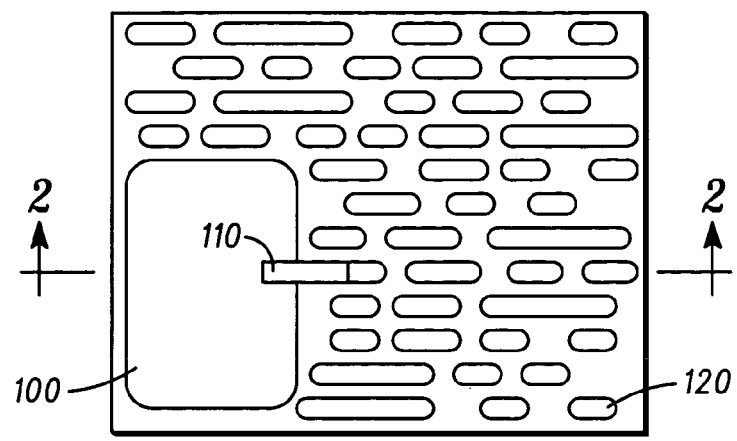
FIG. 1 depicts a plan view of a CMOS photodiode in accordance with the prior art.
Figure 2:
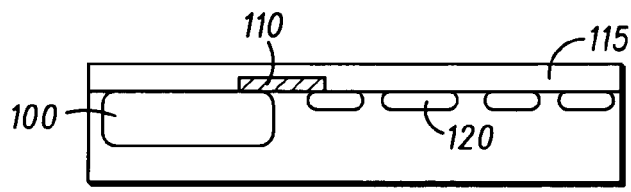
FIG. 2 depicts an elevation cross-section view of the prior art CMOS photodiode generally depicted in FIG. 1.

As previously addressed, co-integration of photosensors with CMOS electronics may operate to substantially limit both the performance of the photosensor and the flexibility of the system architectural design. This may be additionally complicated by progression to more advanced CMOS technology generations which generally utilize trench isolation, non-transparent silicides and increasing numbers of interconnect levels. These factors, as well as others, generally degrade performance of photodetectors 100 co-integrated with CMOS electronics 120. In effect, the photodetector 100 becomes 'trapped' within the CMOS technology 'box', as generally depicted, for example, in FIGS. 1 and 2, with a lateral interconnect 110 further reducing available imaging 'real estate'. One way to address this problem, in accordance with various representative aspects of the present invention, is to release the PD 200 from the 'box' and place a PD 200 array in its own separate active layer positioned over a dielectric layer 115 and a wafer surface containing the electronics 220 with a vertical interconnect 210 disposed therebetween—also generally depicted, for example, in FIGS. 14 and 15. Such a three-dimensional, vertically stacked configuration of the optically active layer over the electronically active layer has been termed by the Inventors herein as a "Vertically Integrated PhotoSensor" or VIPS.

Removal of the photosensors from the CMOS electronics design and fabrication 'box' allows independent optimization of photosensor device performance and system architectural design. For the photosensor, this may include, for example: choice of materials; pixel design (optical and electronic); fabrication processes resulting in detectors with much higher fill factors (on the order of about 3–4×greater); and/or the like. The utilization of the third dimension substantially obviates competition for lateral pixel area and also allows greater functionality to be incorporated into any given 2D form factor. The underlying electronics may then be designed effectively without compromise from the optical coupling requirements of the photosensor. This generally allows for the use of much needed additional layers of interconnect metallization for more efficient layout of chips and also opens the door for the incorporation of greater image processing functions on-chip with more creative architectural partitioning of the imaging system potentially leading to single-chip camera applications. In summary, vertical integration generally provides inter alia improved performance, lower system cost, increased functionality, lower power consumption and smaller form factors.

VIPS configurations additionally provide many advantages for both the active layers. In the electronic active layer, not only does the removal of the PD free up space within each pixel element for electronic circuits, but the photo-absorbing layer above it may also be suitably adapted to operate as a natural light shield. Since excellent optical coupling is a given in this arrangement, there is generally no need to limit the number of interconnect levels used. This could enable some innovative architectural partitioning of the imager (e.g., co-integration of the pixel electronics together with the image processing circuitry, for example) that could lead to improved performance and lower cost imagers.

Most of the benefits and advantages for the optically active layer generally relate to greater freedom in the design and processing of the PD devices. Since it is removed from the Si, the optically active layer may be composed of more optimal materials; i.e., materials that have higher absorption coefficients for any given spectral range of interest. These might include other semiconductor materials such as, for example: GaAs; InP; GaN; HgCdTe and their related materials and/or combinations thereof; or SiC; SiGe; or even a-Si or p-Si or x-Si.

Figure 3:
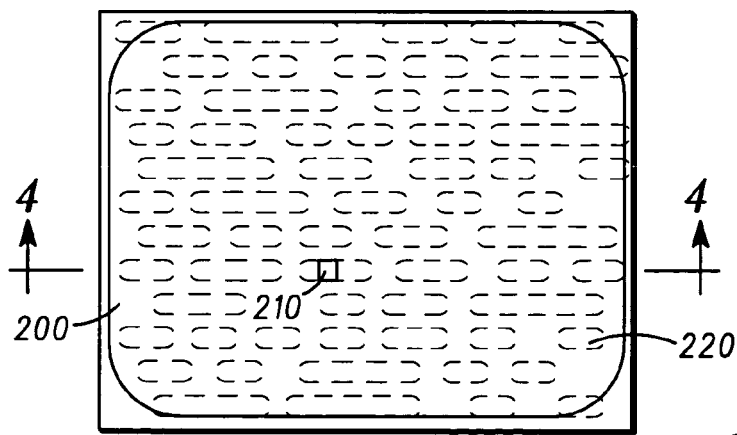
FIG. 3 representatively illustrates a plan view of a vertically integrated CMOS photosensing element in accordance with one exemplary aspect of the present invention.
Figure 4:
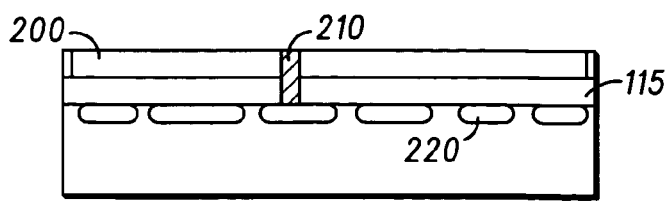
FIG. 4 representatively illustrates an elevation cross-section view of the vertically integrated CMOS photosensing element representatively illustrated, for example, in FIG. 3.

The positioning of the optically active layer over the electronic active layer offers optical advantages including a near 100% optical fill factor for the pixel (as generally illustrated, for example, in FIG. 3), and virtual elimination of optical throughput loss and optical crosstalk generated by reflections and scattering. Additionally, a dedicated optical active layer is more amenable to advanced optical designs including backside reflecting mirrors and resonant cavities. These attributes each help boost the amount of signal captured by the PD, but the near 100% fill factor also leads to an effective reduction of the perimeter-to-area ratio and a corresponding decrease in the normalized dark current. Accordingly, both the signal and noise characteristics are greatly improved by vertical integration in accordance with various representative and exemplary aspects of the present invention.

Moreover, since the active layers are generally distinct and isolated, there is the potential for separate optimization in their fabrication processing. This factor is largely dependent on how the two layers may be brought into close proximity and will be discussed vide infra.

Although there are many possible means to realize the vertically integrated optical active layer and integrate photosensors within this layer, as generally described above, one exemplary method is detailed here for clarity. A representative process begins with a substantially fully processed CMOS "host" wafer onto which the "donor" wafer (generally depicted, for example, in FIG. 5) will be bonded. The host wafer typically contains electronic circuitry for in-pixel signal operations such as amplification, readout, ADC, etc. and potentially other image processing and/or peripheral circuitry. The top level of interconnect metallization on the host wafer comprises metal landing pads for the various types of interconnects to be made between the host and donor wafers. These may include, for example: the pads for intra-pixel connections between the individual photodiodes in the optically active layer and their corresponding pixel circuits in the electronic active layer on the host wafer; pads for interconnects between the common side of the photodiodes and the host wafer; and pads for I/O connections off-chip. Alignment keys for the wafer-to-wafer bonding process may also be included in this layer. These pads may be encapsulated with, for example, $SiO_2$ and the wafer planarized with CMP processing.

Figure 5:
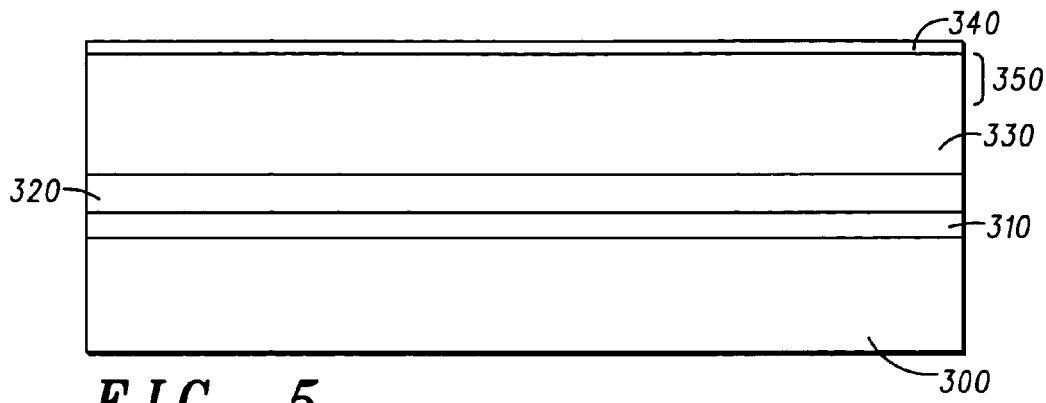
FIG. 5 representatively illustrates an elevation cross-section view of a precursor structure for use in an exemplary method of fabricating a vertically integrated photosensing device in accordance with the present invention.
Figure 6:
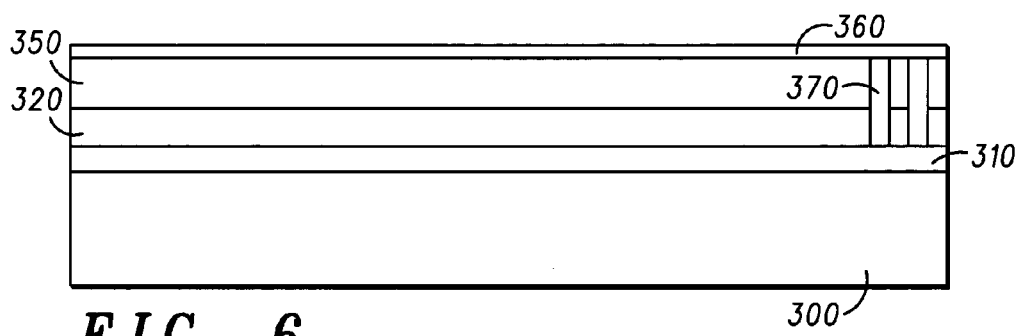
FIG. 6 representatively illustrates an elevation cross-section view of an intermediate structure for use in an exemplary method of fabricating a vertically integrated photosensing device in accordance with the present invention.

In this embodiment, the donor wafer starts as an SOI wafer: FIG. 5; Si layer 300 and buried oxide ('BOX') layer 310. The SOI wafer also may be configured with a relatively thin, lowly doped $p^-$ top Si layer 320 (on the order of about 2000–5000 Å). An intrinsic or $p^-$-epitaxial layer 330 is then grown to a thickness on the order of about 2–4 $\mu$m to better accommodate the low absorption coefficient of the Si material. A thermal oxide 340 is next grown on the top surface which provides a high quality interface for inter alia minimization of photodiode dark current levels. At this point, alignment keys may be formed in the Si layer to mate to the corresponding keys on the host wafer during the bonding process, and to serve as base keys for alignment of subsequent (post wafer bond) process steps. A photosensor region 320, 350 (see FIG. 6) may be defined by further processing of the donor wafer, which may include patterning of via features 370 followed by deposition of thermal oxide (e.g., $SiO_2$) 360 over the processed top surface of the donor wafer.

Figure 7:
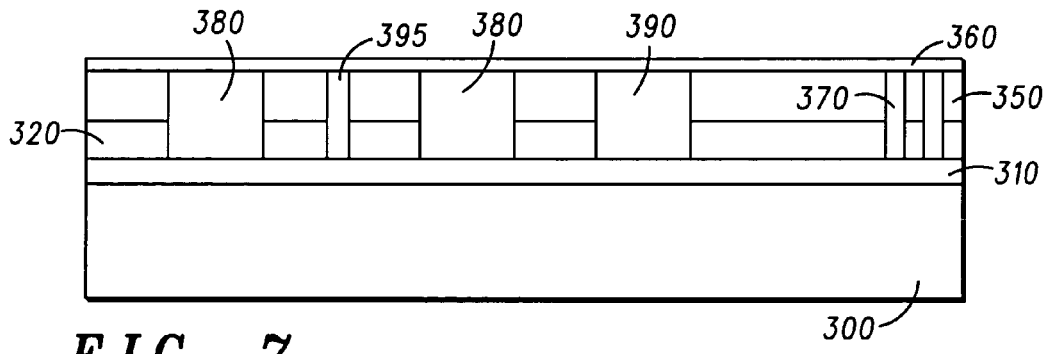
FIG. 7 representatively illustrates an elevation cross-section view of an intermediate structure for use in an exemplary method of fabricating a vertically integrated photosensing device in accordance with the present invention.

Photodiodes may then fabricated within this donor wafer using a series of ion implant steps. As generally illustrated in FIG. 7, a patterned, multiple-energy, n-type implant (e.g., $p^+$) may be used to convert the thickness of the Si layer to form a column of n-type material 380 at the center of each pixel forming the anode of the photodiodes. A portion of this column, most generally the region near the implanted surface, may be implanted to a sufficiently high concentration to allow ohmic contact to this region. This forms a vertical pn junction in which the depletion region extends laterally outward from the n-type columns 380 to between the p-type columns 395, 390. This configuration results in photogenerated charge carriers being drawn toward the axis of the PN junction and the interconnect 517. As the surrounding regions are intrinsic or nearly so, These depletion regions can generally extend laterally for many microns even to the point of overlapping with neighboring SCRs. In this case, any non-uniformities in doping level and/or thickness may result in non-uniform photocarrier collection regions and "ill defined" pixels. To alleviate this situation, a patterned, multiple-energy, p-type implant (e.g., B+) may be employed to form relatively narrow, moderately doped walls that act to limit the lateral extent of the depletion regions and define the shape of the pixels. This column may also contain a highly doped portion, again most likely near the implanted surface, for ohmic contacting purposes. Through this ohmic contact, the implanted p-type grid can then be used to uniformly apply a bias (typically ground) to the common cathodes of the array of photodiodes.

Figure 8:
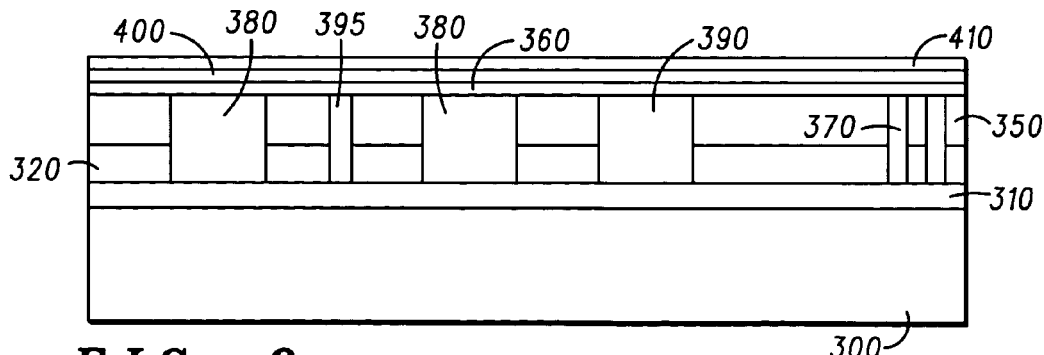
FIG. 8 representatively illustrates an elevation cross-section view of an intermediate structure for use in an exemplary method of fabricating a vertically integrated photosensing device in accordance with the present invention.

After the formation of the photodiodes, an optically reflective structure (comprising, for example: thermal oxide layer 360; a dielectric layer 400, such as, for example, $SiO_2$, $Si_3N_4$, etc.; and a bond interface layer 410) may optionally be formed over the top of the wafer, as generally depicted, for example, in FIG. 8. This structure may ultimately become a backside reflector once the wafer is flipped over, wafer bonded and the substrate removed. The reflector may alternatively, conjunctively or sequentially comprise a single metallic layer (e.g., Al, Ag, Au, etc.) or multiple, alternating layers of high and low refractive index dielectric materials forming a distributed Bragg reflector (DBR). Blanket metallic reflectors generally offer the advantage of high reflectivity in thin films, but pose challenges for the subsequent etching of the contact vias. Alternatively, the metal layer may be deposited, prior to bonding, and patterned with a hole for the via, but at the cost of an additional masking step. Dielectric-based DBRs are generally easier to etch through, but multiple layer pairs are typically required to achieve sufficient reflectivity. FIG. 8 shows the application of a single layer pair DBR made from $SiO_2/Si_3N_4$ 400. Finally, even without an optimized reflector integral to the transferred layer structure, some level of reflectance could likely be realized from the interconnect landing pads residing directly underneath the pixels within the top level of metallization on the host CMOS wafer. In this case, a smooth, reflective surface and a large fill factor of these landing pads would also be beneficial.

Figure 9:
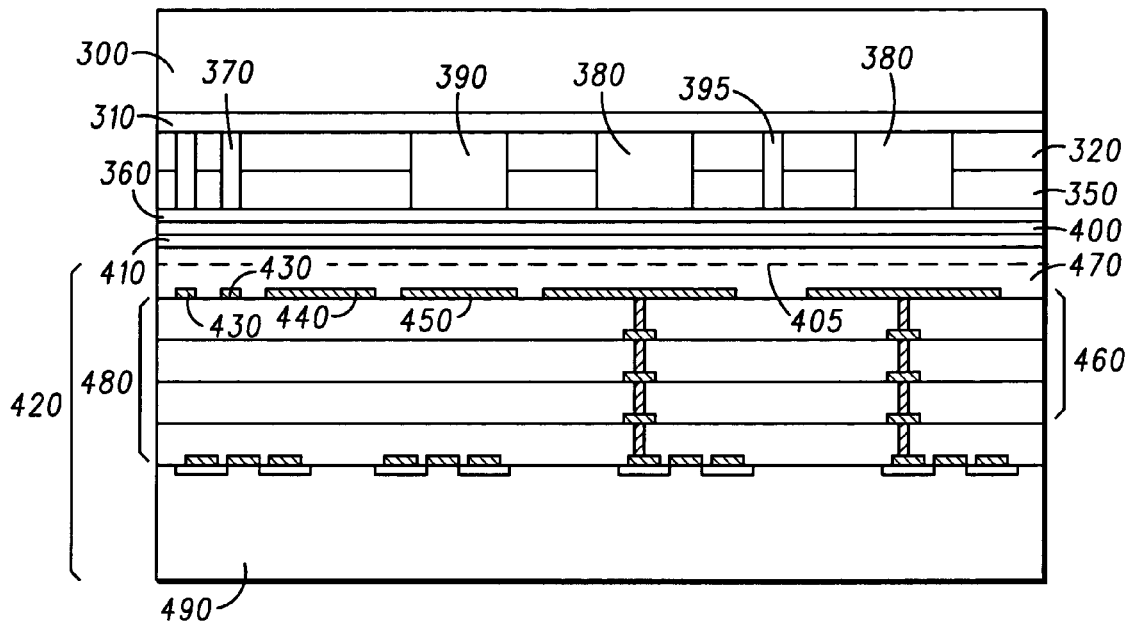
FIG. 9 representatively illustrates an elevation cross-section view of an intermediate structure for use in an exemplary method of fabricating a vertically integrated photosensing device in accordance with the present invention.
Figure 10:
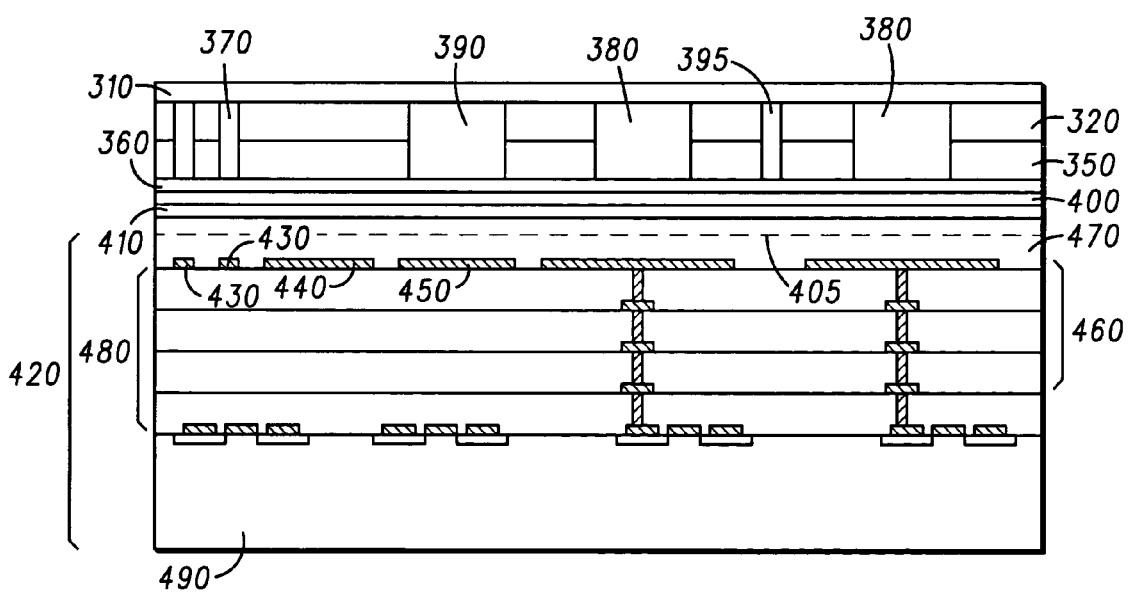
FIG. 10 representatively illustrates an elevation cross-section view of an intermediate structure for use in an exemplary method of fabricating a vertically integrated photosensing device in accordance with the present invention.

After both host 420 and donor wafers (FIG. 5) are planarized and prepped, they are aligned and bonded together (as shown, for example, in FIG. 9) with the substrate removed, as described vide supra. The CMOS host wafer 420 may generally comprise a Si substrate 490, n-type pixel interconnects 460, multiple levels of metal interconnects 480, alignment keys 430, I/O pads 440, p-type contacts 450 and/or the like. The host 420 and donor wafers (FIG. 5) are bonded through interface 405 in metal interconnect layer 470. After substrate removal (see FIG. 10), the top surface of the bonded wafer composite is the original buried oxide layer 310 (BOX) of the SOI donor wafer (FIG. 5) which acted as an etch stop in the substrate removal process. Alignment of all subsequent process steps may be made relative to the keys within the transferred layer that are now exposed from the back side.

Figure 11:
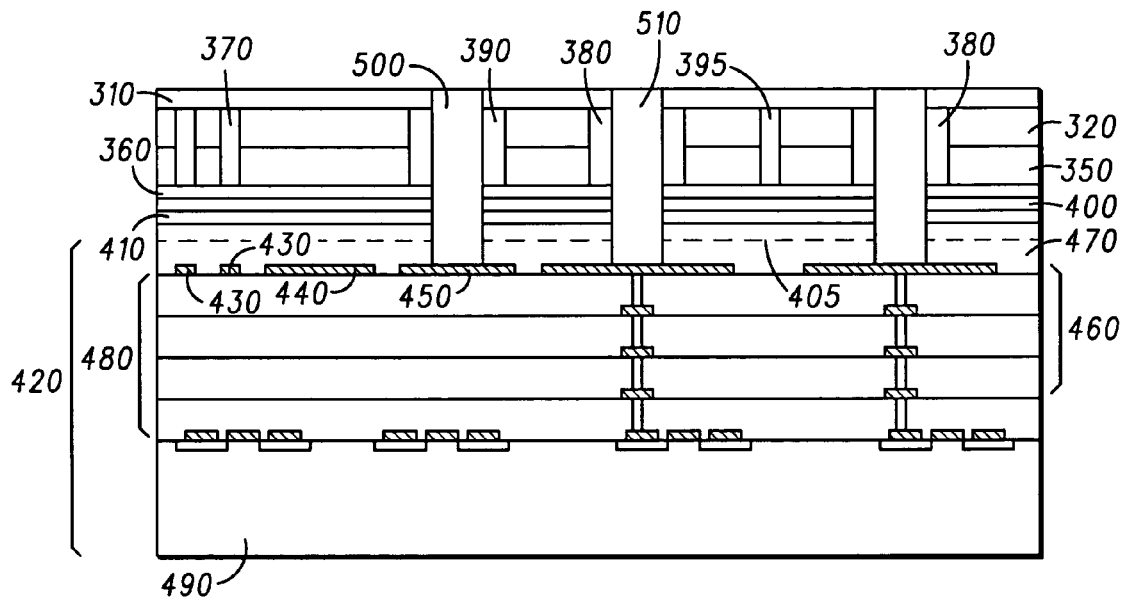
FIG. 11 representatively illustrates an elevation cross-section view of an intermediate structure for use in an exemplary method of fabricating a vertically integrated photosensing device in accordance with the present invention.

Thereafter, as generally illustrated in FIG. 11, relatively high aspect ratio via holes 500, 510 are etched within each pixel from the composite structure's top surface, through: the BOX layer 310 at the surface; the Si semiconductor layer 320, 350; the bottom reflector 400; and the $SiO_2$ layers 470 on either side of the wafer bonded interface 405, stopping on the landing pads 460 of the CMOS wafer 420. Care must be taken with this etch step to ensure both optimal performance and reliability. To simultaneously meet the requirements of high pixel fill factor and thick optical absorption layer for high conversion efficiency, the aspect ratio of this etch must be suitably high, particularly as the pixel pitch is reduced. On the other hand, because of the differing material types that must be penetrated, it may be challenging to achieve sufficiently smooth sidewalls to allow high yield of the sidewall ohmic contacts and metal interconnection from the contact to the landing pad during subsequent processing. As shown in FIG. 7, this etch step is also used to define a via 500 within the p+ implanted regions 390 where sidewall contacts and interconnects will also be made.

Figure 12:
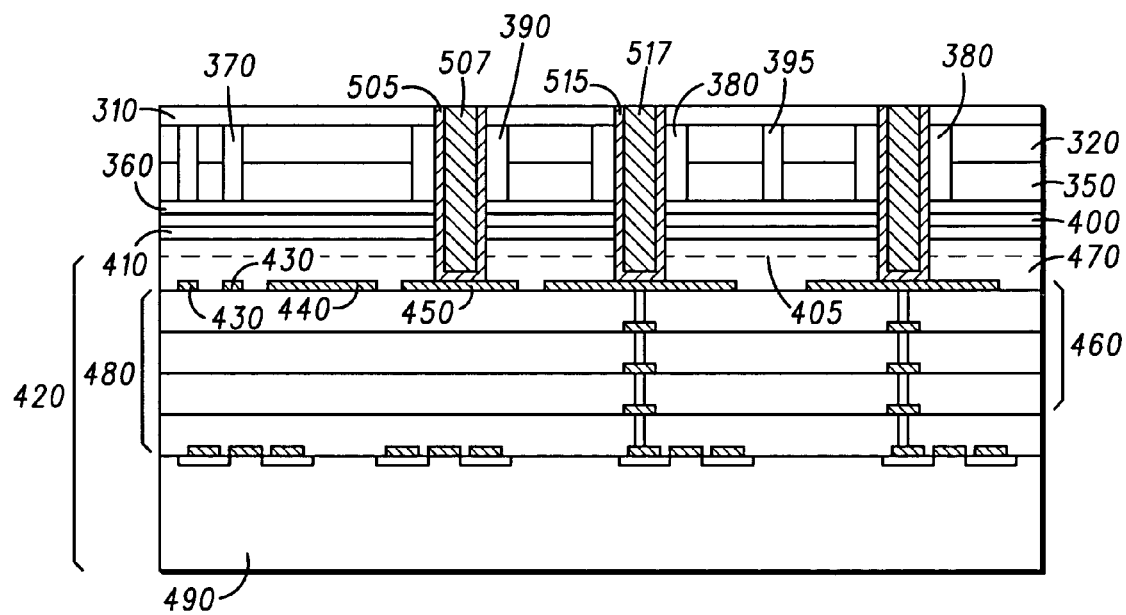
FIG. 12 representatively illustrates an elevation cross-section view of an intermediate structure for use in an exemplary method of fabricating a vertically integrated photosensing device in accordance with the present invention.

As illustrated in FIG. 12, after the vias 500, 510 are cleared, metallization 505, 515 is deposited covering the sidewalls and bottom of the etched via 500, 510 forming ohmic contacts to the $n^+$ material 380 (or $p^+$ material 390) along the sidewall and interconnecting this contact to the via landing pad 450. Optionally, the metallized vias 500, 510 may then be plugged with a plated metal 507, 517 (e.g., Cu and/or the like) then the surface re-planarized.

Figure 13:
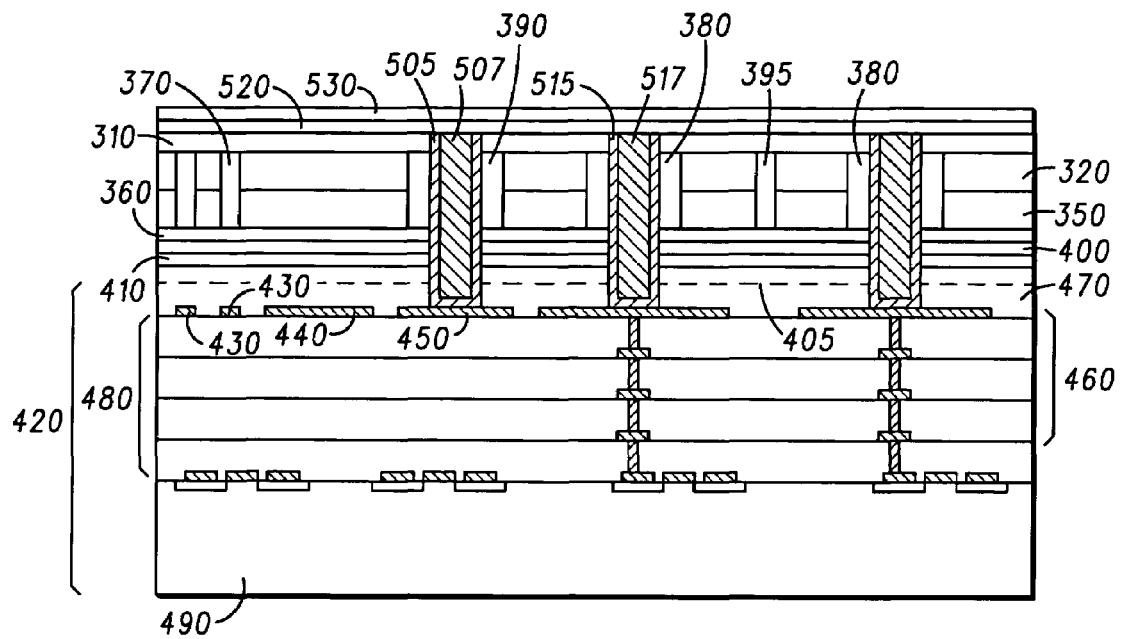
FIG. 13 representatively illustrates an elevation cross-section view of an intermediate structure for use in an exemplary method of fabricating a vertically integrated photosensing device in accordance with the present invention.

If a top side partial reflector 520 is to be included to for a resonant cavity around the absorptive Si layer, it may be deposited at this point in conjunction with a passivation layer 530 as generally depicted, for example, in FIG. 13. Typically, such a reflector might comprise a multi-layer dielectric DBR stack.

Figure 14:
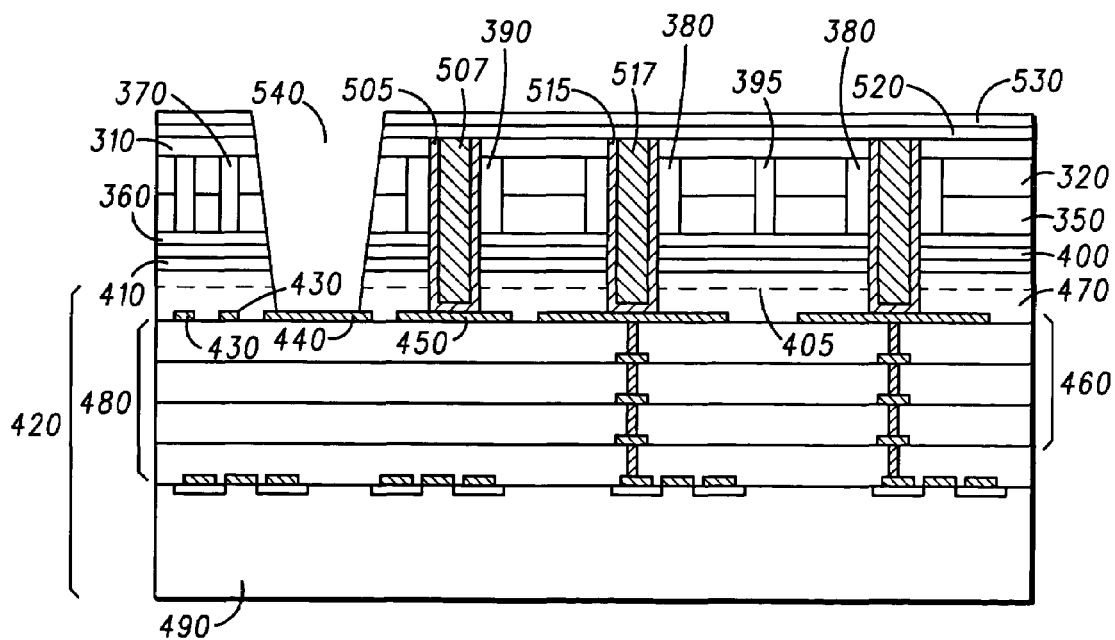
FIG. 14 generally illustrates an elevation cross-section view of an exemplary vertically integrated photosensing device in accordance with a representative aspect of the present invention.

As a final fabrication step, as illustrated in FIG. 14, access vias 540 to the large area I/O pads 440 around the perimeter of the chip may be opened. This step has non-critical etch requirements and may easily be accomplished with standard etch processes.

Figure 15:
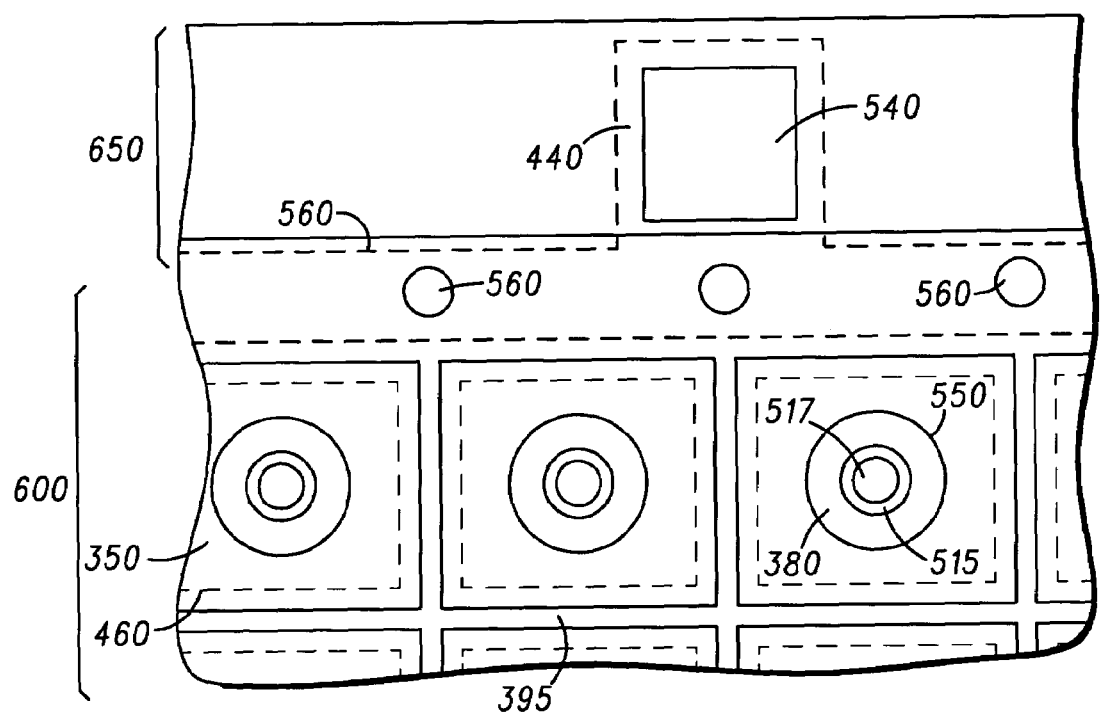
FIG. 15 generally illustrates a plan view of an exemplary vertically integrated photosensing device in accordance with a representative aspect of the present invention.

To clarify the configuration of these elements, FIG. 15 shows the development of an exemplary device, in accordance with representative aspects of the present invention, in plan view with the locations of the key elements clearly identified. The lower half 600 of FIG. 15 is a region of the pixels array showing all or portions of eight (8) pixels, while the upper half 650 of the Figure show a peripheral region immediately adjacent to the array. FIG. 15 also shows: the n-type implanted columns 380; the associated depletion region 550 surrounding them, within the intrinsic or $p^-$-blanket epi layer 350; the common grounding strip 560 of the parent CMOS wafer 420; and the common cathode interconnect via and metal plugs 560. Finally, FIG. 15 also shows the access vias 540 to the I/O pads 440 for probing or wire bond interconnection off-chip. The displayed size of this I/O pad 440 is only a fraction of the actual size of the actual I/O pad for convenience of illustration.

The optically active layer may be transferred to the CMOS wafer via any wafer bonding technique now known or otherwise hereafter described in the art. This result can be achieved in many ways, but a representative and exemplary approach may be one in which the two components to be bonded are coated with $SiO_2$ and subsequently planarized. The surfaces are then chemically treated and thereafter mated together to form a covalent-based bond at the $SiO_2$ coordination interface. The bonding process generally takes only several seconds and may be performed at room temperature. The substrate originally containing the optical active layer is then removed by chemical and/or mechanical means (e.g., CMP). In order to achieve suitably thin transferred layers, it may be helpful to the substrate removal process if this wafer further comprises a suitably adapted etch stop layer.

There are many possible modes of implementing the desired vertically integrated structure. Some representative variables in the process may include the partitioning of the photodiode fabrication process into pre-bond and post-bond sections. At one extreme, a "blank" optical active layer having substantially no pre-processing may be bonded with the final diode fabrication and interconnection to the CMOS wafer performed at some point after the bonding. This may be attractive from the standpoint that critical alignment of the blank layer to the CMOS wafer would generally not be required. A drawback of this approach is that is highly undesirable to have to do high temperature processing to fabricate the photosensors after the bonding process as this may have an adverse impact on the already processed CMOS devices below. The preferred approach may be more toward the other extreme in which the photodiodes are substantially completely fabricated prior to bonding leaving only via etching, ohmic contact formation, inter-active layer interconnection and passivation processing for post-bond processing.

Two representative and exemplary modes are disclosed in which bonding may be performed. The first is wafer-to-wafer bonding in which two (or more) wafers (preferably of matching diameter for greatest efficiency) are mated and bonded in a substantially unitary step. If the photodiodes (along with alignment keys) are pre-processed in the active layer, a critical alignment must generally be done before the wafers are mated. Subsequent processing is then best aligned to the optically active layer with any misalignment tolerance generally accommodated in oversized interconnect metallization pads in the CMOS wafer. If the optically active layer is blank, alignment may be registered to keys in the CMOS wafer (if made visible with a coarsely aligned clearing etch step, for example). In this bonding mode, the surface area of the optical active layer is generally not efficiently utilized since, typically, the active area does not match the entire area of the CMOS chip.

The second representative bonding mode is die-to-wafer. Here, the wafer containing the optical active layer is typically diced prior to bonding and the chips are individually aligned to corresponding sites on the CMOS wafer. If the optically active layer was initially blank, then these die-to-wafer bonds generally do not require any critical alignment and substantially all of the post-bond processing may be easily aligned to the exposed alignment keys in the CMOS wafer. Contrariwise, if the optically active layer contains processed photodiodes, then each die generally needs to be critically aligned to each site on the CMOS wafer. Subsequent processing typically must then be aligned at each individual site, or if aligned simultaneously, to the CMOS wafer, where any error in the die-to-wafer alignment step is generally absorbed in the optical active layer.

Regardless of the bonding method employed, the end result is a monocrystalline semiconductor layer that has been transferred to the surface of the CMOS wafer within which the array of photodiodes reside. The primary advantage of having this optically active layer comprised of single crystal material (as opposed to amorphous or poly-crystalline material) is the potential for higher performance and flexibility. In principle, the single crystal material generally demonstrates much lower dark currents due inter alia to the absence of a high density of grain boundaries and other mid-gap defects as compared with non-crystalline material. In fact, there is no fundamental reason why photosensors fabricated in such materials cannot approach the performance of high quality CCDs. A secondary benefit is the potential for additional levels of electronic integration within this layer that would otherwise be unavailable in the conventional art.

Unlike the Thin Film on ASIC (TFA) approach of fabricating integrated photosensing arrays, representative and exemplary embodiments of the present invention provide a CMOS-based imaging army having photosensing elements fabricated in a vertically integrated optically active layer comprising monocrystalline material(s) that is/are subsequently transferred to the CMOS wafer surface. The thickness of the optically active layer is generally sufficiently thin to allow for a high density of electrical interconnects to the CMOS wafer (e.g., about one per pixel; on the order of about 1 connection per 10–250 square microns, and more preferably about 1 connection per 10–100 square microns). The interconnections Themselves may be manufactured using standard, wafer level, CMOS via and metalization technology.

Skilled artisans will appreciate that another benefit of a transferred optical active layer is the ability to utilize materials that are generally non-native to the Si substrate containing the CMOS. Such non-native semiconductor materials may have widely varying optical absorption characteristics, allowing the option to choose a material that is the most optimally suited for a particular application. These materials may include the compound semiconductors such as GaAs, InP, and GaN and related materials, as well as Ge, SiGe, SiC, etc. These representative materials generally span the entire range of UV, visible, and NIR wavelengths. The absorption of Si is relatively weak across the visible range while many of the other materials are an order of magnitude stronger. This fact implies that optically active layers of non-Si materials could be much thinner, for the same absorption level, making the fabrication of the photosensors substantially easier.

Image sensing outside of the visible band may be applied to many applications. In the near UV, some examples may include: forensics; dermatology for detection of skin cancers; "solar blind" imaging for applications in which solar illumination (sunlight) is perceived as a noise source; and/or the like. NIR imaging may also be used for "night vision" (using either natural or artificial illumination), alcohol-based flame detection, biological analysis, etc.

In other applications, multi-spectral sensing and comparative imaging may be of great value. Here, information may be extracted from the differences (or similarities) in images taken within different ranges of the spectrum (e.g., UV, visible, NIR). With the vertical integration methodology described herein, one sensor may be included within the CMOS layer (for example, a visible sensor) and another sensor (for example, UV or NIR) could be implemented within the vertically integrated active layer.

What has been described thus far is the implementation of only photosensing devices within the vertically integrated active layer. Clearly, more functionality could be implemented within this layer in the form of, for example, CMOS electronics; which circuitry could be used inter alia for parallel processing of captured images.

With the bonding approaches described, vertical integration of active layers need not be limited to a single layer. As long as the wafer surface can be sufficiently planarized to allow substantially void-free bonding, the process could be repeated indefinitely; in principle, to provide a vertical stack of active layers all or some of which are interconnected and each providing some distinct or otherwise additional functionality.

In the foregoing specification, the invention has been described with reference to specific exemplary embodiments; however, it will be appreciated that various modifications and changes may be made without departing from the scope of the present invention as set forth in the claims below. The specification and figures are to be regarded in an illustrative manner, rather than a restrictive one and all such modifications are intended to be included within the scope of the present invention. Accordingly, the scope of the invention should be determined by the claims appended hereto and their legal equivalents rather than by merely the examples described above. For example, the steps recited in any method or process claims may be executed in any order and are not limited to the specific order presented in the claims. Additionally, the components and/or elements recited in any apparatus claims may be assembled or otherwise operationally configured in a variety of permutations to produce substantially the same result as the present invention and are accordingly not limited to the specific configuration recited in the claims.

Benefits, other advantages and solutions to problems have been described above with regard to particular embodiments; however, any benefit, advantage, solution to problems or any element that may cause any particular benefit, advantage or solution to occur or to become more pronounced are not to be construed as critical, required or essential features or components of any or all the claims.

As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted by those skilled in the art to specific environments, manufacturing specifications, design parameters or other operating requirements without departing from the general principles of the same.

We claim:

1. A method for making an electronic imaging component, said method
   comprising the steps of:
   providing an electronics layer;
   providing a photosensing element, said photosensing element fabricated in a vertically integrated optically active layer;
   providing a substantially vertical interconnect;
   providing a junction substantially surrounding and at least partially encompassing said vertical interconnect, wherein charge carriers may be substantially laterally drawn toward the axis of at least one of said junction and said interconnect;
   bonding said optically active layer to said electronics layer, wherein said optically active layer is disposed substantially proximate to a metalization surface of said electronics layer.

2. The method of claim 1, wherein said electronics layer is substantially fully processed.

3. The method of claim 1, wherein said photosensing element comprises at least one of a photodiode, a photomultiplier, a phototransistor, and a photoconductor.

4. The method of claim 1, wherein said optically active layer comprises at least one of Si, GaAs, InP, GaN, HgCdTe, a-Si, p-Si, p-Si, x-Si, Ge, SiGe, SiC, a monocrystalline material, a polycrystalline material and an amorphous material.

5. The method of claim 1, wherein said bonding comprises at least one of wafer-to-wafer bonding and die-to-wafer bonding.

6. The method of claim 1, wherein said interconnect comprises at least one of a metallized via, an electrical conductor, p-Si and a semiconductor; and said interconnect extends substantially through said optically active layer.

7. A method for making an electronic imaging component array, said method comprising the steps of:
   providing an electronics array layer;
   providing a photosensing element array, said photosensing element array fabricated in a vertically integrated optically active layer;
   providing a plurality of substantially vertical interconnects;
   providing a plurality of junctions substantially surrounding and at least partially encompassing said plurality of vertical interconnects, wherein charge carriers may be substantially laterally drawn toward the axes of at feast one of said plurality of junctions and said plurality of interconnects;
   bonding said optically active layer to said electronics layer, wherein said optically active layer is disposed substantially proximate to a metalization surface of said electronics layer.

8. The method of claim 7, wherein said plurality of vertical interconnects comprises a density of about one connection per up to about 10–250 square microns.

9. The method of claim 7, wherein said plurality of interconnects comprise a plurality of at least one of metallized vias, electrical conductors, p-Si and semiconductors.

10. The method of claim 7, wherein the photosensing element fill factor is up to about 75%.

11. The method of claim 7, wherein the photosensing element fill factor is greater than 75%.

12. The method of claim 11, wherein the photosensing element fill factor is up to about 100%.

13. The method of claim 7, wherein the electronic processing circuitry is optimized for substantial parallel processing of array-captured images.

14. The method of claim 7, further comprising the step of providing a plurality of vertically integrated optically active layers.

15. The method of claim 7, further comprising the step of providing a plurality of vertically integrated electronics layers.

16. The method of claim 7, wherein said optically active layer comprises at least one of Si, GaAs, InP, GaN, HgCdTe, a-Si, p-Si, x-Si, Ge, SiGe, SiC, a monocrystalline material, a polycrystalline material, and an amorphous material.

* * * * *